(12) United States Patent
Manipatruni et al.

(10) Patent No.: US 9,136,848 B2
(45) Date of Patent: Sep. 15, 2015

(54) HIGH SPEED PRECESSIONALLY SWITCHED MAGNETIC LOGIC

(71) Applicants: Sasikanth Manipatruni, Hillsboro, OR (US); Dmitri E. Nikonov, Beaverton, OR (US); Ian A. Young, Portland, OR (US)

(72) Inventors: Sasikanth Manipatruni, Hillsboro, OR (US); Dmitri E. Nikonov, Beaverton, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/659,349

(22) Filed: Mar. 16, 2015

(65) Prior Publication Data

US 2015/0194963 A1    Jul. 9, 2015

Related U.S. Application Data

(63) Continuation of application No. 13/678,877, filed on Nov. 16, 2012, now Pat. No. 8,988,109.

(51) Int. Cl.
*H03K 19/16* (2006.01)
*H03K 17/80* (2006.01)

(52) U.S. Cl.
CPC ............... *H03K 19/16* (2013.01); *H03K 17/80* (2013.01)

(58) Field of Classification Search
None
See application file for complete search history.

(56) References Cited

U.S. PATENT DOCUMENTS

| | | | |
|---|---|---|---|
| 8,063,459 B2* | 11/2011 | Ranjan et al. | 257/421 |
| 2004/0218443 A1 | 11/2004 | Johnson | |
| 2008/0191295 A1 | 8/2008 | Ranjan et al. | |
| 2012/0154063 A1 | 6/2012 | Nikonov et al. | |
| 2012/0161261 A1 | 6/2012 | Garner et al. | |
| 2012/0176154 A1 | 7/2012 | Behin-Aein et al. | |
| 2012/0267735 A1 | 10/2012 | Atulasimha et al. | |

OTHER PUBLICATIONS

Non-Final Office Action from U.S. Appl. No. 13/678,877 mailed Aug. 13, 2014, 11 pgs.
International Search Report and Written Opinion of the International Searching Authority dated Feb. 10, 2014, in International Patent Application No. PCT/US2013/066174.
International Preliminary Report on Patentability from PCT/US2013/066174 mailed May 28, 2015, 8 pgs.

* cited by examiner

*Primary Examiner* — Crystal L Hammond
(74) *Attorney, Agent, or Firm* — Blakely, Sokoloff, Taylor & Zafman LLP

(57) ABSTRACT

High speed precessionally switched magnetic logic devices and architectures are described. In a first example, a magnetic logic device includes an input electrode having a first nanomagnet and an output electrode having a second nanomagnet. The spins of the second nanomagnet are non-collinear with the spins of the first nanomagnet. A channel region and corresponding ground electrode are disposed between the input and output electrodes. In a second example, a magnetic logic device includes an input electrode having an in-plane nanomagnet and an output electrode having a perpendicular magnetic anisotropy (PMA) magnet. A channel region and corresponding ground electrode are disposed between the input and output electrodes.

16 Claims, 11 Drawing Sheets

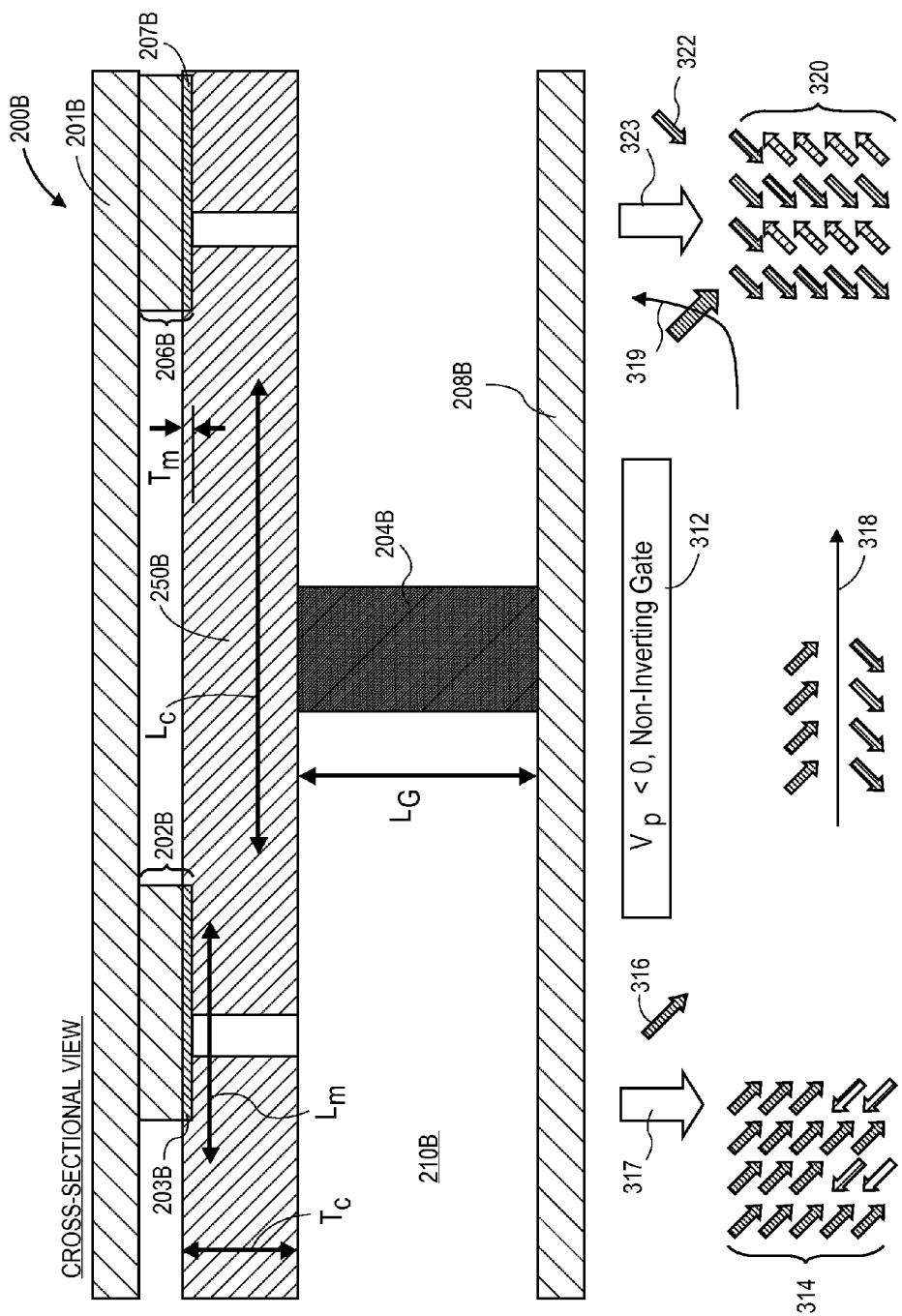

ns.com/patents/US9136848

HIGH SPEED PRECESSIONALLY SWITCHED MAGNETIC LOGIC

CROSS-REFERENCE TO RELATED APPLICATIONS

This application is a continuation of U.S. patent application Ser. No. 13/678,877, filed on Nov. 16, 2012, the entire contents of which are hereby incorporated by reference herein.

TECHNICAL FIELD

Embodiments of the invention are in the field of logic devices and architectures and, in particular, high speed precessionally switched magnetic logic devices and architectures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

The operation of spin torque devices is based on the phenomenon of spin transfer torque. If a current is passed through a magnetization layer, called the fixed magnetic layer, it will come out spin polarized. With the passing of each electron, its spin (which is angular momentum of the electron) will be added to the magnetization in a next magnetic layer, called the free magnetic layer, and will cause its small change. This is, in effect, a torque-causing precession of magnetization. Due to reflection of electrons, a torque is also exerted on the magnetization of an associated fixed magnetic layer. In the end, if the current exceeds a certain critical value (given by damping caused by the magnetic material and its environment), the magnetization of the free magnetic layer will be switched by a pulse of current, typically in about 1 nanosecond. Magnetization of the fixed magnetic layer may remain unchanged since an associated current is below its threshold due to geometry or due to an adjacent anti-ferromagnetic layer.

However, significant improvements are still needed in the speed and energy required for switching of magnetization. Herein is described such improvements by way of precessionally switched magnetic logic devices and architectures.

BRIEF DESCRIPTION OF THE DRAWINGS

FIG. 3 illustrates the cross-sectional view of the spin logic device having non-collinear magnets of FIG. 2B along with an operation involving a non-inverting gate scenario, in accordance with an embodiment of the present invention.

DESCRIPTION OF THE EMBODIMENTS

High speed precessionally switched magnetic logic devices and architectures are described. In the following description, numerous specific details are set forth, such as specific magnetic layer integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to high speed precessionally switched devices, such as magnetic logic devices. Embodiments may include, or may be relevant to or for, one or more of augmented complimentary metal oxide semiconductor (CMOS) architectures, instantly on-normally off logic architectures, magnetic embedded memory, magnetic tunnel junction (MTJ) based devices, non-volatile logic, or spin logic. In a specific embodiment, described in greater detail below, a high-speed spin logic device employs non-collinear magnets to enable 10 GHz operation.

Embodiments described herein may enable fabrication of fast and non-volatile logic devices and gates or grounds. By way of contrast, previous approaches to fabricating such devices and to achieve non-volatility have included forming nodes from nanoscale ferromagnets (nanomagnets). The ferromagnets are switched by a spin-polarized current flowing between an input and an output nanomagnet and, thus, exerting spin torque. In past approaches, the magnetization, which is determined by the shape of the ferromagnet, has been collinear in all nanomagnets. Therefore, the initial spin torque is zero, and circuits including such elements rely on thermal fluctuations of magnetization to begin a switching event. However, an initial spin torque is zero may impact switching speed and lead to performance variability. For example, the speed of switching such devices may be slow. Additionally, or instead, timing for switching initiation may vary and be sensitive to device variability.

In order to address the above described issues with previous approaches, one or more embodiments described herein are directed to spin logic devices having non-collinear magnets at the input and output of a switching element. In one embodiment, such an arrangement permits non-zero torque at the start or initiation of switching. Specific such embodiments include a performance improvement in speed enabling clocking operation of logic, e.g., less than 100 ps or approximately 10 GHz clocking operation. Other specific such embodiments, enable overcoming reliance on thermal noise to initiate the switching.

Figure 1A:
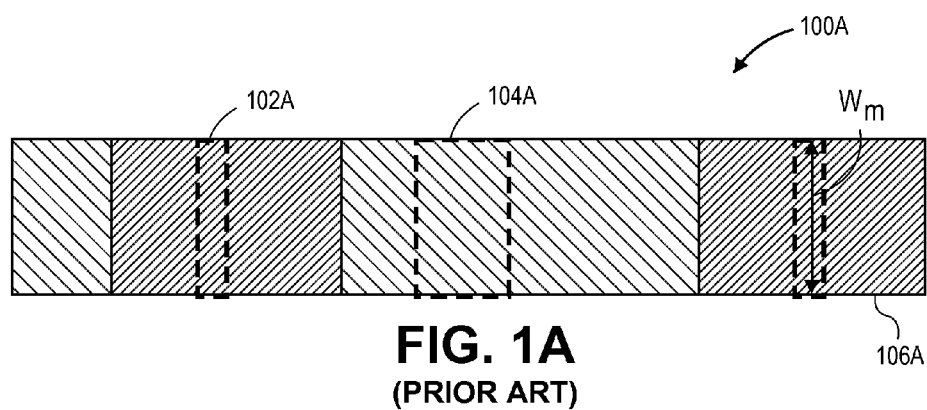
FIG. 1A illustrates a top view of a spin logic element having collinear magnets at the input and output of the spin logic element.

By way of illustration, FIG. 1A illustrates a top view of a spin logic element having collinear magnets at the input and output of the spin logic element. Referring to FIG. 1A, a spin logic element 100A includes an input 102A, a ground electrode region 104A and an output 106A. The input 102A and output 106A each include a ferromagnetic layer (nanomagnet) having a width (Wm). As represented by the rectangular geometry of the input 102A and output 106A, spins of the ferromagnetic layers of the input 102A and output 106A are collinear. It is noted that, throughout, the ground terminal is depicted closer to the left magnet (102A) than to the right magnet (106A), as may be needed for isolation of input from output.

Figure 1B:
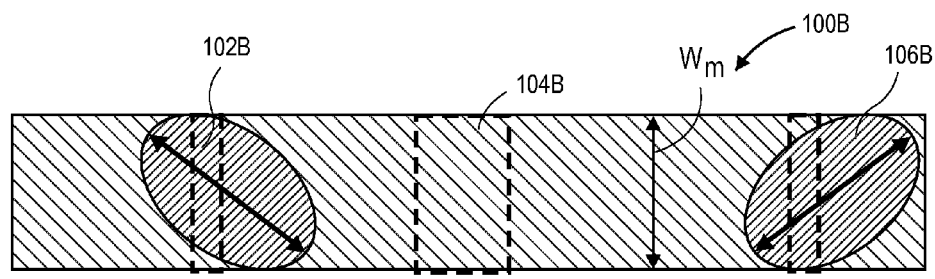
FIG. 1B illustrates a top view of a spin logic element having non-collinear magnets at the input and output of the spin logic element, in accordance with an embodiment of the present invention.

In contrast to the conventional arrangement of FIG. 1A, FIG. 1B illustrates a top view of a spin logic element having non-collinear magnets at the input and output of the spin logic element, in accordance with an embodiment of the present invention. Referring to FIG. 1B, a spin logic element 100B includes an input 102B, a ground electrode region 104B and an output 106B. The input 102B and output 106B each include a ferromagnetic layer (nanomagnet) having a width (Wm). However, as represented by the elliptic geometries of the input 102B and output 106B, which are non-parallel, spins of the ferromagnetic layers of the input 102B and output 106B are non-collinear. In one such embodiment, such an arrangement of non-collinear magnets enables high speed spin logic.

Figure 2A:
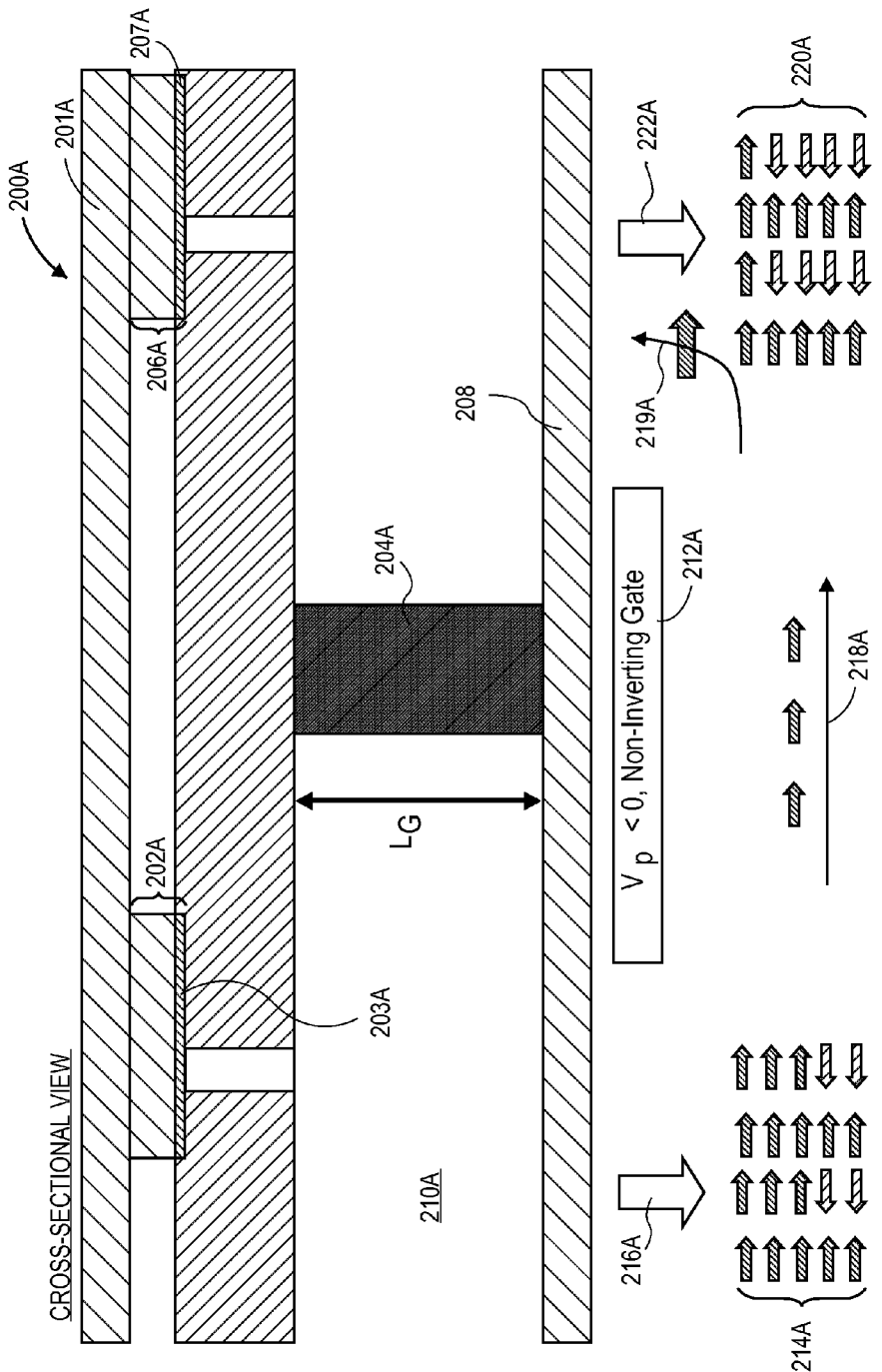
FIG. 2A illustrates a cross-sectional view of a spin logic device having collinear magnets, such as the collinear magnets described in association with FIG. 1A.

By way of further illustration, FIG. 2A illustrates a cross-sectional view of a spin logic device having collinear magnets, such as the collinear magnets described in association with FIG. 1A. Referring to FIG. 2A, a spin logic device 200A includes a supply voltage plane 201A coupled with an input 202A and an output 206A. The input 202A and output 206A each include a ferromagnetic layer (nanomagnet), such as layers 203A and 207A, respectively. A ground electrode 204A is disposed between the input 202A and the output 206A. A metal ground line 208A may be coupled with the ground electrode 204A, as depicted in FIG. 2A. Additional materials, such as oxide layer 210A may also be included, e.g., to act as a spin filter.

Referring again to FIG. 2A, an operation involving a non-inverting gate scenario 212A is shown for a plurality of input spin states 214A having a net spin direction 216A. The dominant magnet injects spin into the output, forcing the output to align, as represented by arrows 218A and 219A. Thus, a plurality of output spin states 220A having a net spin direction 222A is obtained. As represented by the horizontal depiction of the plurality of input spin states 214A and the plurality of output spin states 220A, the spins of the pluralities 214A and 220A are collinear.

Figure 2B:
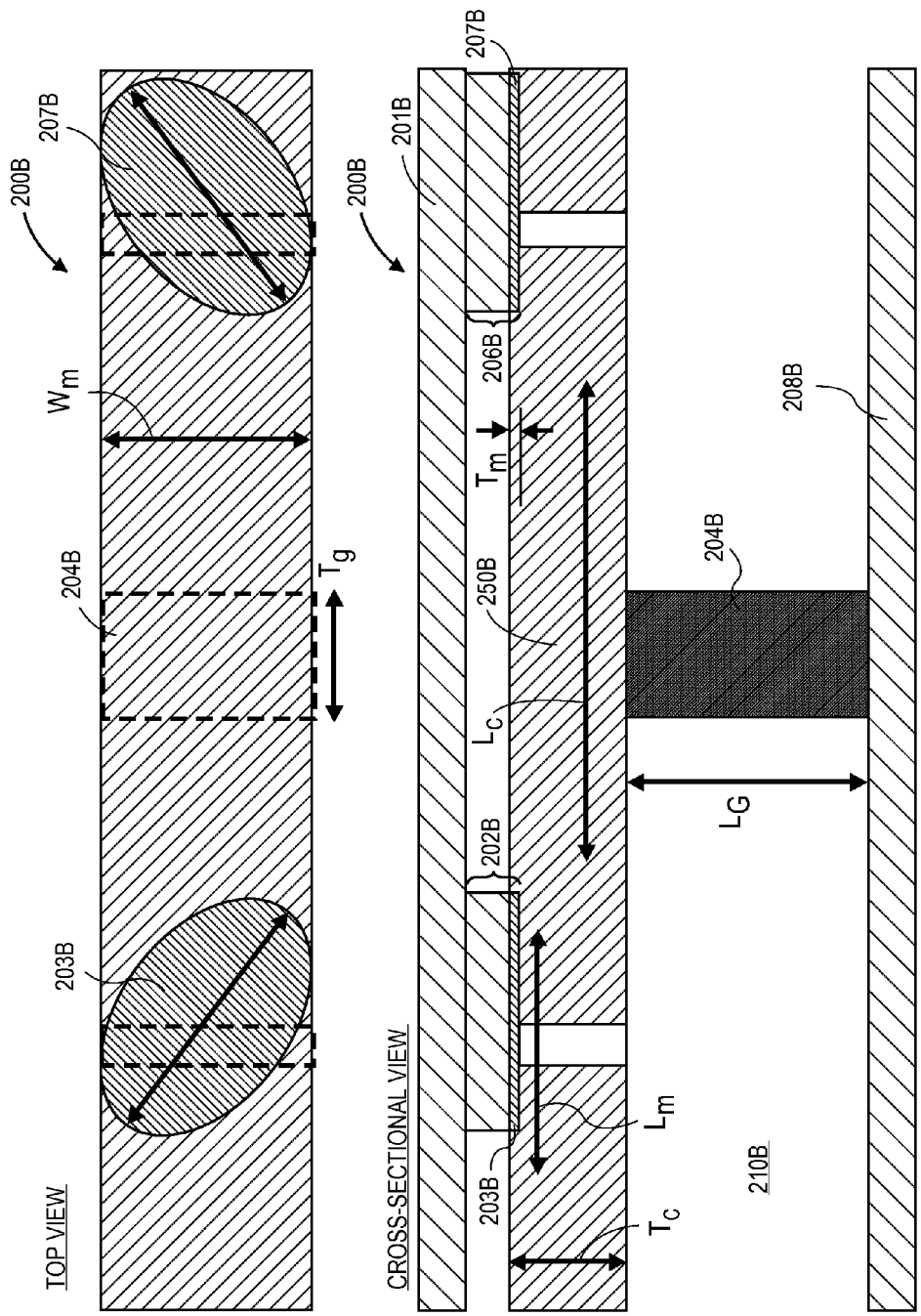
FIG. 2B illustrates both a top view and a cross-sectional view of a spin logic device having non-collinear magnets, such as the non-collinear magnets described in association with FIG. 1B, in accordance with an embodiment of the present invention.

In contrast to the conventional arrangement of FIG. 2A, FIG. 2B illustrates both a top view and a cross-sectional view of a spin logic device having non-collinear magnets, such as the non-collinear magnets described in association with FIG. 1B, in accordance with an embodiment of the present invention. Referring to FIG. 2B, a spin logic device 200B includes a supply voltage plane 201B coupled with an input 202B and an output 206B. The input 202B and output 206B each include a ferromagnetic layer (nanomagnet), such as layers 203B and 207B, respectively, having a thickness $T_m$, width $W_m$ and length $L_m$. A ground electrode (or region, as shown as a dashed line in the top view) 204B is disposed between the input 202B and the output 206B and has a ground length $L_G$ and ground thickness $T_G$. A corresponding channel region 250B has a channel length $L_C$ and thickness $T_C$. A metal ground line 208B may be coupled with the ground electrode 204B, as depicted in FIG. 2B. Additional materials, such as oxide layer 210B may also be included, e.g., to act as a spin filter. As described in association with FIG. 1B, spins of the ferromagnetic layers of the input 202B and output 206B, i.e. of magnetic layers 203B and 207B, are non-collinear, as is also depicted in the top view of FIG. 2B.

FIG. 3 illustrates the cross-sectional view of the spin logic device having non-collinear magnets of FIG. 2B along with an operation involving a non-inverting gate scenario, in accordance with an embodiment of the present invention. Referring to FIG. 3, an operation involving a non-inverting gate scenario 312 is shown for a plurality of input spin states 314 having an angular net spin direction 316 corresponding to a net spin direction 317. The dominant magnet injects spin into the output, forcing the output to align, as represented by arrows 318 and 319. Thus, a plurality of output spin states 320 having an angular net spin direction 322, corresponding to a net spin direction 323, is obtained. As represented by the angular depiction of the plurality of input spin states 314 and the plurality of output spin states 320 In FIG. 3, the spins of the plurality 314 are non-collinear with the spins of the plurality 320. As such, operation of the precessionally switched magnetic logic device of FIG. 3 involves flow of spin due to asymmetry in spin populations, as shown. A net perpendicular torque from the input magnet dominates the output magnet dynamics.

Referring again to FIGS. 1B, 2B and 3, one or more embodiments include a spin logic device operating via precessional switching of nanomagnets. The precessional switching dynamics is achieved by a non-collinear magnet configuration. In one such embodiment, input and output magnets are tilted at approximately 45°, in opposite directions, with respect to the channel direction. The non-collinearity produces a strong spin torque from the beginning of the nanomagnet dynamics, resulting in a faster response. Traditional spin logic devices, such as those described in association with FIGS. 1A and 2A, employ collinear magnets, which produce no torque at the initial time when the voltage is applied. In such traditional spin logic devices, the magnets eventually start switching in response to thermal noise.

In an embodiment, planar magnets are used and operated with precessional switching, e.g., as described for the precessional switching spin logic device of FIG. 3. The elliptic magnets (seen in the top view of FIG. 2B) allow for control of the direction of magnetization by using shape anisotropy. In a specific such embodiment, the shape anisotropy is achieved by rotation of a planar magnet greater than 0 degrees but less than 45 degrees to provide a rectangular shape with rounded corners. Stable equilibria occur when magnetization is directed along the major (longest) axis of the ellipses, as defined by patterning of the magnetic material. The major axes of the input and output magnets are pointed at approximately 90 degrees with respect to one other. In an embodiment, such an arrangement maximizes an applied spin torque at the initial instant, in contrast to a collinear device. The stability of the final state is ensured by applying a pulse of voltage necessary to switch the magnetization proximate to the opposite direction. Subsequently, the magnets relax into a stable equilibrium.

In an embodiment, the structure described in association with FIGS. 2B and 3 are fabricated using multiple stacked metallic layers. The magnets are formed from thin patterned ferromagnetic metals. A metallic channel, formed by a wire etched in a copper layer (e.g., for long spin diffusion length), may be used to couple the input and output magnets in order to conduct spin current from the input magnet to the output magnet. A metal via may be used to couple the channel region to a ground plane. The dimensions of the ground plane may be selected to optimize the energy-delay of the device.

Overall, in an embodiment, the directionality of spin logic is set by the geometric asymmetry in the device. The area of overlap of the input magnet with the channel is larger than the area of overlap of the output magnet. This difference in overlap leads to asymmetric spin conduction where the input magnet sets up the direction of the spin currents in the channel. In a specific embodiment, an oxide gap in the channel permits isolation of the input and output side of the magnets.

In another aspect, perpendicular magnetic anisotropy (PMA) may be used to enhance the switching speed of a magnetic logic device. For example, in an embodiment, in-plane and PMA magnets are combined to produce precessional switching, providing an alternate device scheme from that described in association with FIG. 3. Specifically, a structure for precessionally switched spin logic may employ both perpendicular magnets and in-plane magnets, e.g., by using an in-plane magnet for an input and PMA magnet for an output. The direction of magnetization is set by the interplay between the PMA of the magnetic material along with the magnetic layer thickness. In one embodiment, such an approach permits more facile fabrication processing and magnetic annealing methods than, e.g., the use of two materials and magnetizing anneal steps. It is to be understood, however, the operating principles for the PMA/in-plane precessional magnets arrangements are similar to those described for the non-collinear arrangements shown in FIGS. 1B, 2B and 3.

Figure 4:
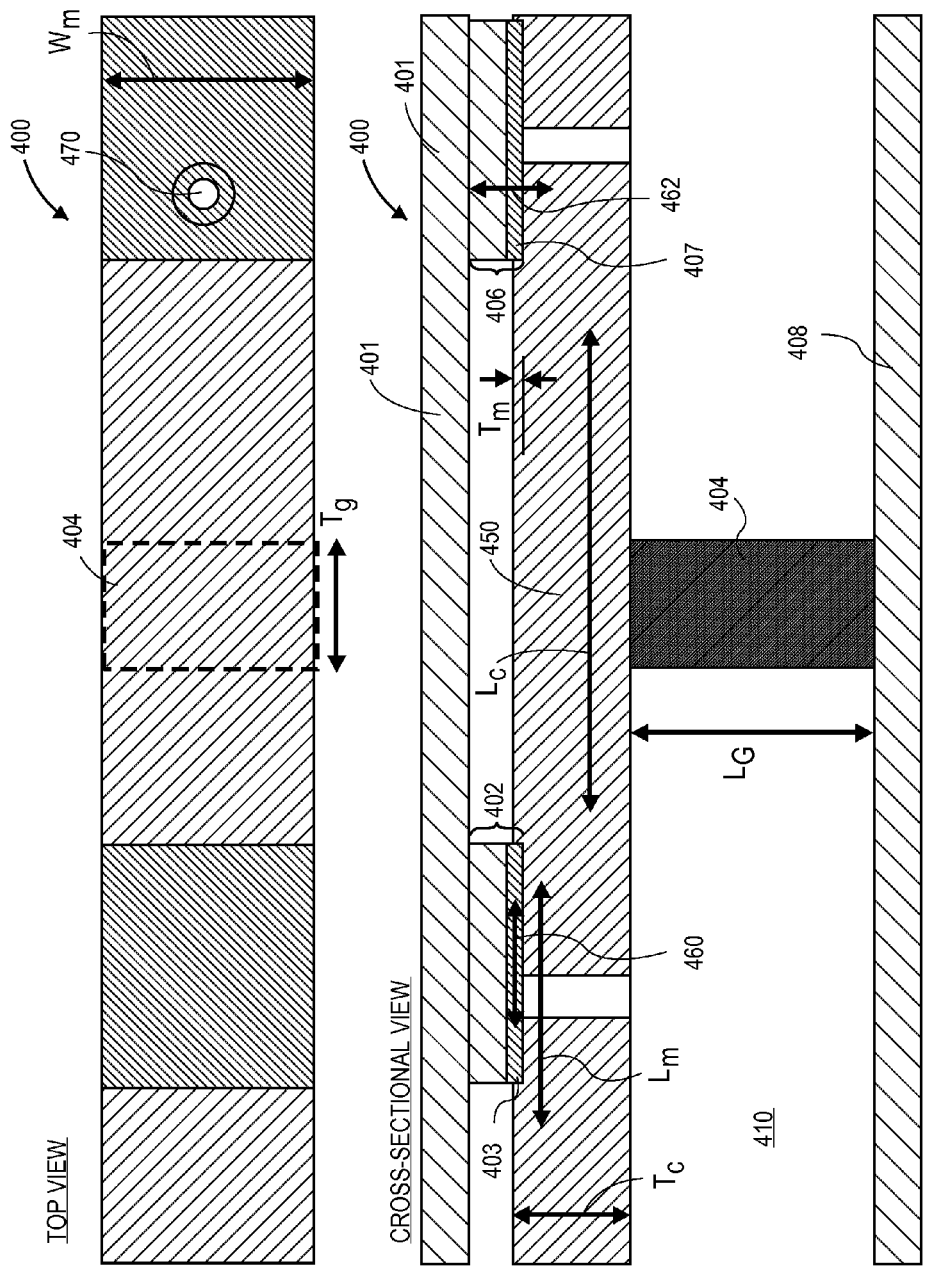
FIG. 4 illustrates both a top view and a cross-sectional view of a spin logic device having a combination of perpendicular magnetic anisotropy (PMA) and in-plane magnets, in accordance with another embodiment of the present invention.

As an example, FIG. 4 illustrates both a top view and a cross-sectional view of a spin logic device having a combination of perpendicular magnetic anisotropy (PMA) and in-plane magnets, in accordance with another embodiment of the present invention. Referring to FIG. 4, a spin logic device 400 includes a supply voltage plane 401 coupled with an input 402 and an output 406. The input 402 and output 406 each include a ferromagnetic layer (nanomagnet), such as layers 403 and 407, respectively. However, the ferromagnetic layer 403 provides an in-plane magnet having a length $L_m$. Meanwhile, the ferromagnetic layer 403 provides a PMA magnet having a thickness $T_m$ and width $W_m$. As indicated by arrows 460 and 462 and the feature 470, the direction of the magnets are orthogonal to one another. It is to be understood that, in another embodiment, the input may include a PMA magnet while the output includes an in-plane magnet. A ground electrode (or region, as shown as a dashed line in the top view) 404 is disposed between the input 402 and the output 406 and has a ground length $L_G$ and ground thickness $T_G$. A corresponding channel region 450 has a channel length $L_C$ and thickness $T_C$. A metal ground line 408 may be coupled with the ground electrode 404, as depicted in FIG. 4, providing ground at the center of the device 400. Additional materials, such as oxide layer 410 may also be included, e.g., to act as a spin filter.

Figure 5:
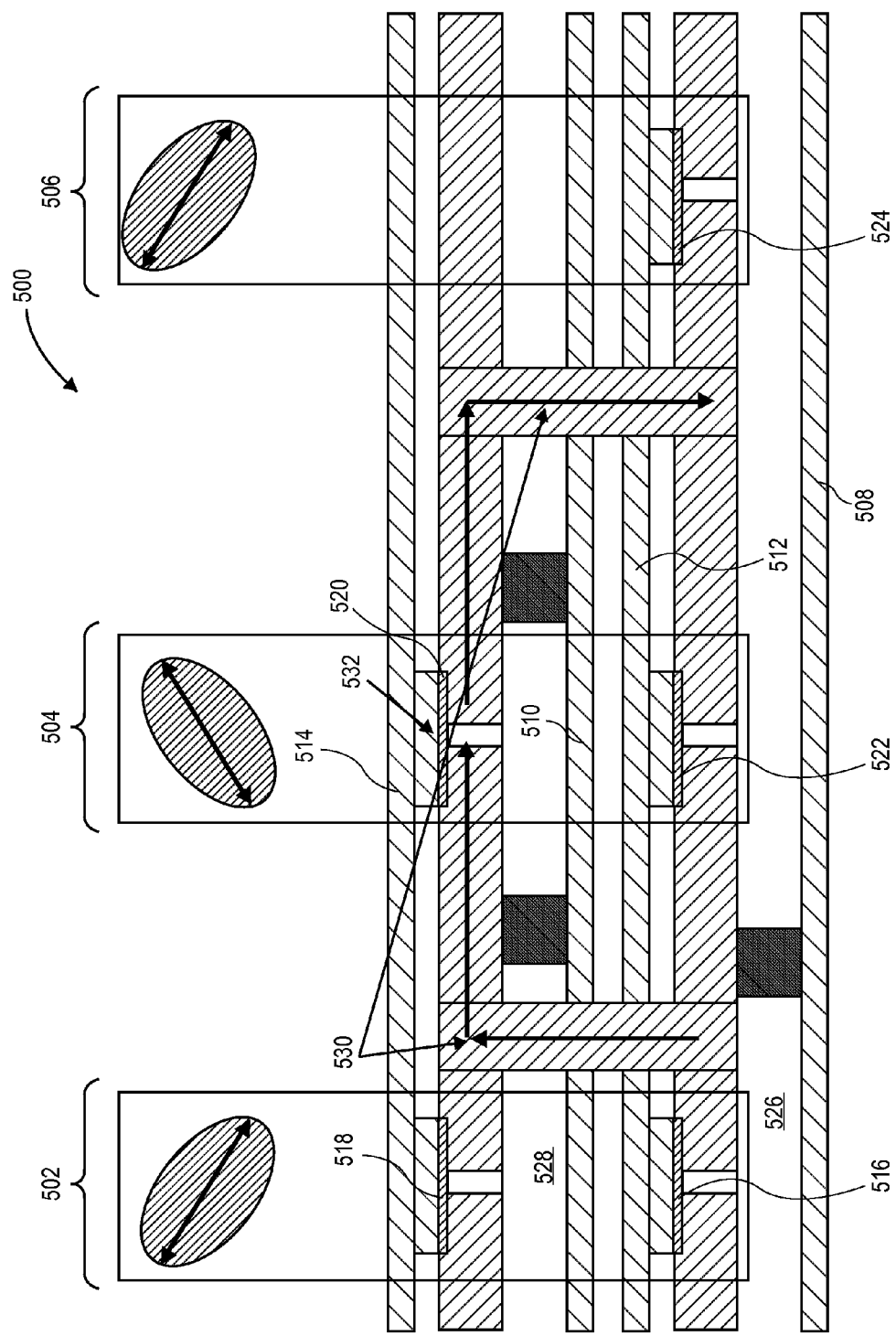
FIG. 5 illustrates a stack 500 of precessional spin logic devices, in accordance with an embodiment of the present invention.

In another aspect, precessional spin logic devices may be stacked for increasing logic density. As an example, FIG. 5 illustrates a stack 500 of precessional spin logic devices, in accordance with an embodiment of the present invention. Referring to FIG. 5, a first stack 502, second stack 504 and third stack 506 of spin logic devices is included in structure 500. Metals ground planes 508 and 510 and voltage supply planes 512 and 514 are arranged in an alternating fashion. Magnetic layers 516, 518, 520, 522, and 524 along with other layers such as oxide layer 526 and 528 are also included. In the arrangement 500, out of plane spin currents 530 and coupled with an interconnect repeater 532, providing alternate magnetic layers magnetized in the same orientation, allowing for signal flow.

The structure 500 may be described as three-dimensional logic having stacked alternating spin logic (ASL) logic layers. The information flow in such an arrangement is ensured by using alternate layers of magnets aligned as shown. The direction of the magnets can be set by the shape of the patterned layers and can be controlled to obtain appropriate alignment.

Figure 6:
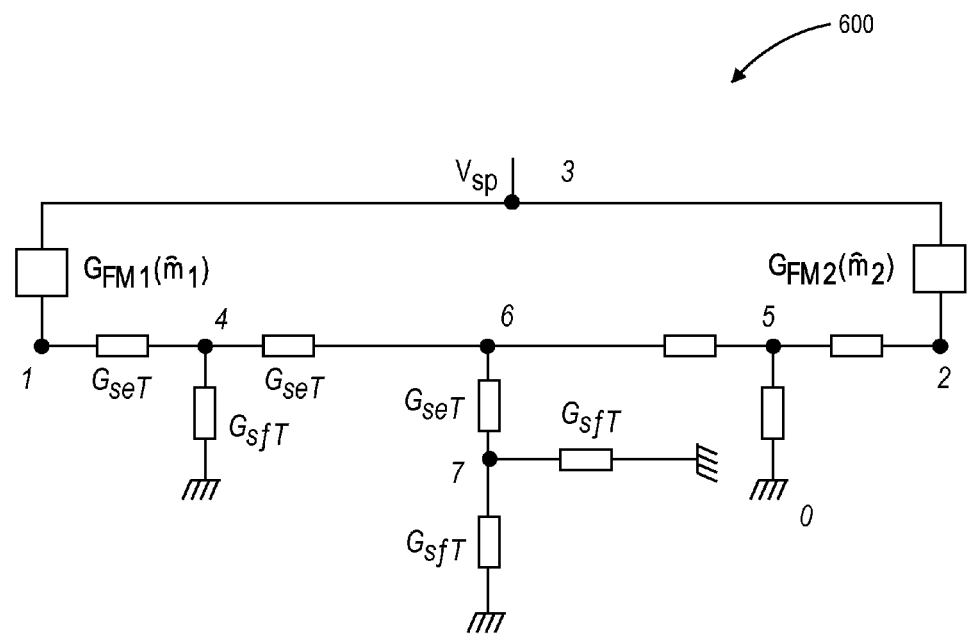
FIG. 6 is an equivalent spin circuit diagram for a spin logic device, in accordance with an embodiment of the present invention.

In another aspect, numerical simulations of an all spin interconnect with self-consistent micromagnetic dynamics and spin transport are provided to illustrate operational aspects of one or more embodiments described herein. For example, a theoretical treatment and numerical simulations of the repeated all spin interconnect show its operation using a multi-physics simulation which treats the nanomagnets as single magnetic moments and uses spin circuit theory to calculate the scalar voltage and vector spin voltages. An equivalent circuit 600 for a section of the spin interconnects is shown in FIG. 6, in accordance with an embodiment of the present invention. Referring to FIG. 6, nodes 1 and 2 are representative of the contact point of the magnets with the channel. Nodes 4, 5, 7 are the internal nodes of the channel to accommodate for spin flip current. Node 6 is the point of contact of the ground connection with the spin channel.

The dynamics of nanomagnets may be described by Landau-Lifshitz-Gilbert equations (1) and (2):

$$\frac{\partial m_1}{\partial t} = -\gamma\mu_0[m_1 \times H_{\text{eff}}] + \alpha\left[m_1 \times \frac{\partial m_1}{\partial t}\right] + \frac{I_{s1}}{eN_s} \quad (1)$$

$$\frac{\partial m_2}{\partial t} = -\gamma\mu_0[m_2 \times H_{\text{eff}}] + \alpha\left[m_2 \times \frac{\partial m_2}{\partial t}\right] + \frac{I_{s2}}{eN_s} \quad (2)$$

Here, Is1 and Is2 are the projections perpendicular to magnetizations of the spin polarized currents entering the nanomagnets. The projections are derived from the spin-circuit analysis. The effective magnetic field Heff originating from shape and material anisotropy, and the Gilbert damping constant α are the properties of the magnets.

Figure 7:
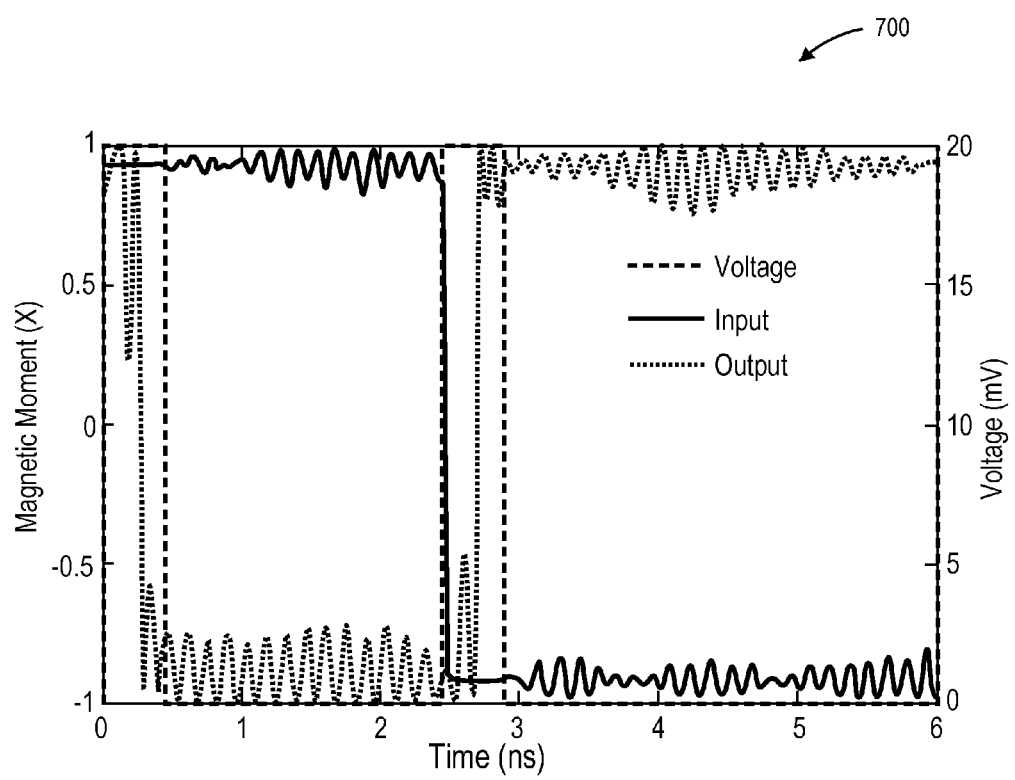
FIG. 7 is a plot of magnetic moment (projection along x-axis) or Voltage (mV) as a function of time (ns) showing simulated response of a precessionally switched spin logic device at a 5 GHz operating conditions, in accordance with an embodiment of the present invention.
Figure 8:
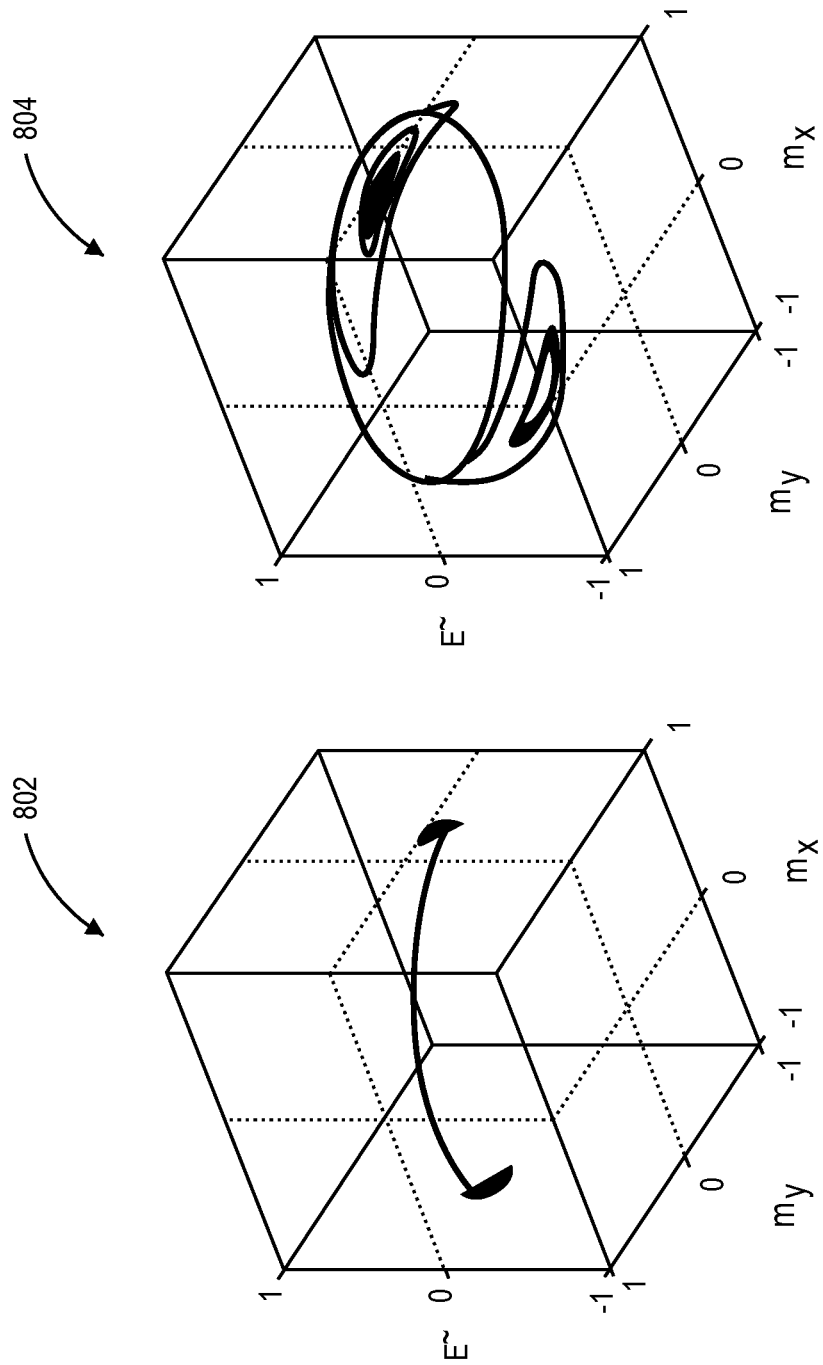
FIG. 8 includes three-dimensional plots showing magnetic moment trajectory for nanomagnets, in accordance with an embodiment of the present invention.

The spin currents may be obtained from the transport model shown in FIG. 7, which is a plot 700 of magnetic moment (X) or Voltage (mV) as a function of time (ns) showing simulated response of the precessionally switched spin logic device at a 5 GHz operating conditions, in accordance with an embodiment of the present invention. The spin equivalent circuit includes the tensor spin conduction matrix determined by the instantaneous direction of magnetization. A self-consistent stochastic solver is used to account for thermal noise in the magnets. FIG. 8 includes three-dimensional plots 802 and 804 showing magnetic moment trajectory for the nanomagnets, in accordance with one or more embodiments of the present invention.

Overall, we have described and experimentally demonstrated the primary physical phenomena for precessionally switched magnetic logic devices. In an embodiment, a manufacturing flow and materials used to fabricate such devices is the same or highly compatible with processes used to fabricate spin torque transfer (STT)-RAM. As such, one or more embodiments provide an approach for fabricating low power spin logic technology while leveraging manufacturing capability used for STT-RAM manufacturing. The long length of propagation of spin polarized currents and their ability to switch nanomagnets have also been demonstrated.

Although the method of fabricating a stack of layers for a precessionally switched magnetic logic device or architecture has not been described in detail herein, it is to be understood that the operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, and/or any other action associated with microelectronic component fabrication.

Figure 9:
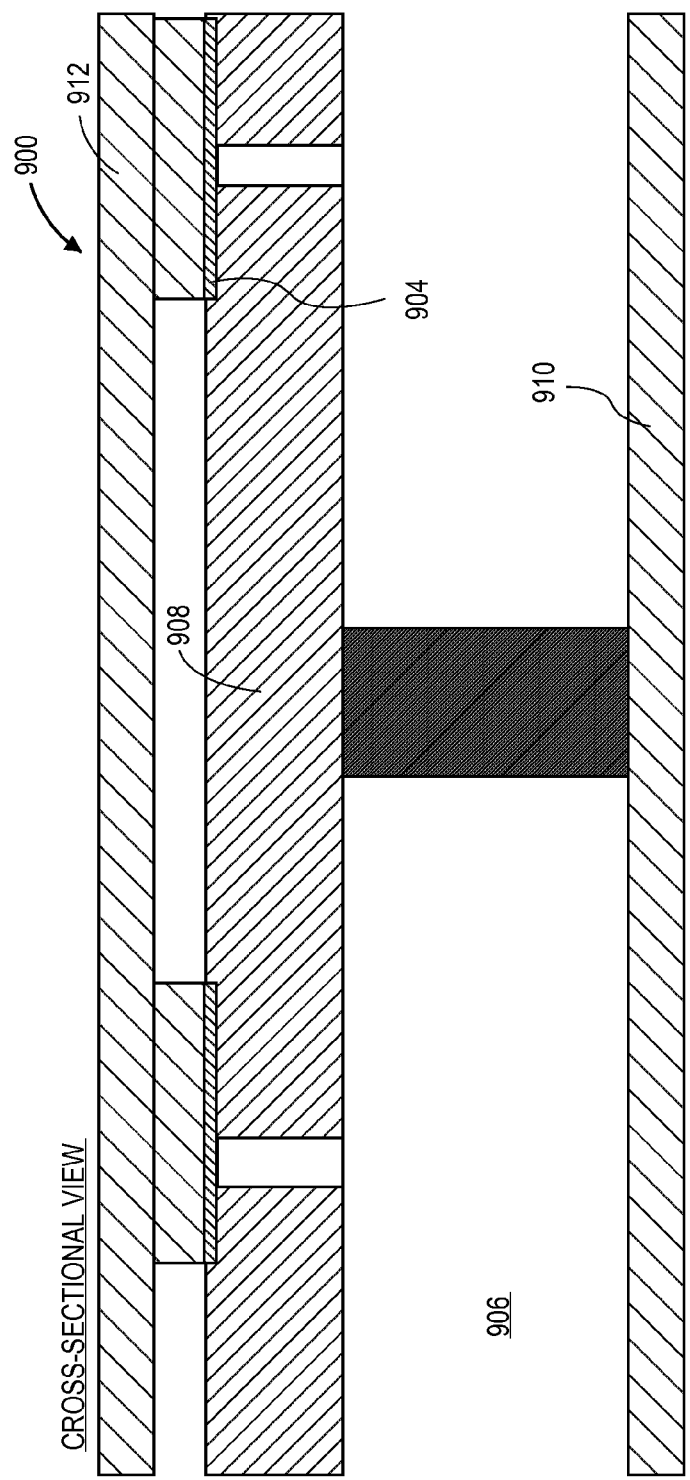
FIG. 9 illustrates a cross-sectional view of a material stack for a spin logic device, in accordance with an embodiment of the present invention.

In order to provide an exemplary stack of materials suitable for manufacture of devices described herein, FIG. 9 illustrates a cross-sectional view of a material stack for a spin logic device, in accordance with an embodiment of the present invention.

Referring to FIG. 9, magnets 902 and 904 may be elemental, based on an alloy, or based on a half-metal material. For example, in one embodiment, magnets 902 and 904 are composed of an elemental material such as, but not limited to, iron (Fe), cobalt (Co), nickel (Ni), or gadolinium (Gd, <290K). In one embodiment, magnets 902 and 904 are composed of an alloy material such as, but not limited to, cobalt iron ($Co_xFe_y$), nickel cobalt ($Ni_xCo_y$), nickel iron ($Ni_xFe_y$), cobalt iron boron ($Co_xFe_yB_z$), samarium cobalt ($Sm_xCo_y$), or neodymium iron boron ($Nd_xFe_yB_z$). In one embodiment, magnets 902 and 904 are composed of a Heusler Alloy (half metal) material such as, but not limited to, copper manganese aluminum ($Cu_2MnAl$), copper manganese indium ($Cu_2MnIn$), copper manganese tin ($Cu_2MnSn$), copper iron silicon ($Co_2FeSi$), cobalt iron aluminum ($Co_2FeAl$), or gallium manganese (GaMn). The Heusler Alloys are ferromagnetic metal alloys based on a Heusler phase. Heusler phases may be intermetallics with particular composition and face-centered cubic crystal structure. The materials are ferromagnetic, even though the constituting elements are not, as a result of the double-exchange mechanism between neighboring magnetic ions. The materials usually include manganese ions, which sit at the body centers of the cubic structure and carry most of the magnetic moment of the alloy.

Referring again to FIG. 9, spin filter layer 906 may be composed of an oxide layer. In on such embodiment, spin filter layer 906 is composed of a material such as but not limited to, magnesium oxide (MgO), aluminum oxide ($Al_2O_3$), or europium oxide (EuO). In an embodiment, spin filter layer 906 is composed of a material suitable for allowing current of a majority spin to pass through the layer, while impeding at least to some extent current of a minority spin to pass through the layer.

Referring again to FIG. 9, channel region 908 may be composed of an elemental material or an alloy. In one such embodiment, channel region 908 is composed of an elemental material such as, but not limited to, copper (Cu) or aluminum (Al). In another such embodiment, channel region 908 is composed of an alloy material such as, but not limited to, copper silicon (CuSi) or copper germanium (CuGe). Pin layers may also be included and, in one embodiment, are composed of an alloy such as, but not limited to, iridium manganese (IrMn), chromium (Cr) based materials, or platinum manganese (PtMn). The pin layers may provide a permanent magnetization.

Other layers for inclusion may include elemental spin hall layers, such as elemental layers. In one embodiment, one or more spin hall layers is composed of platinum (Pt), tantalum (Ta), doped copper (Cu), or gold (Au). Elemental scrambler layers may also be included. In one embodiment, one or more scrambler layers is composed of elemental ruthenium (Ru). Metal ground 910 and supply voltage planes 1012 may be composed of conductive materials such as, but not limited to, copper (Cu).

The direction of magnetization in the magnets 902 and 904 may be switched using a spin-polarized current. An electrical current is generally non-polarized (e.g. consisting of about 50% spin-up and about 50% spin-down electrons). A spin polarized current is one with a greater number of electrons of either spin-up or spin-down. In operation, in an embodiment, if an applied voltage is negative, the spin of the output is a copy of the spin of the input (e.g., input 302 and output 306 of FIG. 3). However, if the applied voltage of positive, the spin of the output is a mirror of the spin of the input. Generally, it is to be understood that initial or final logic states are a ferro-magnet's domain and the domain is manipulated and/or controlled by a spin current.

Figure 10:
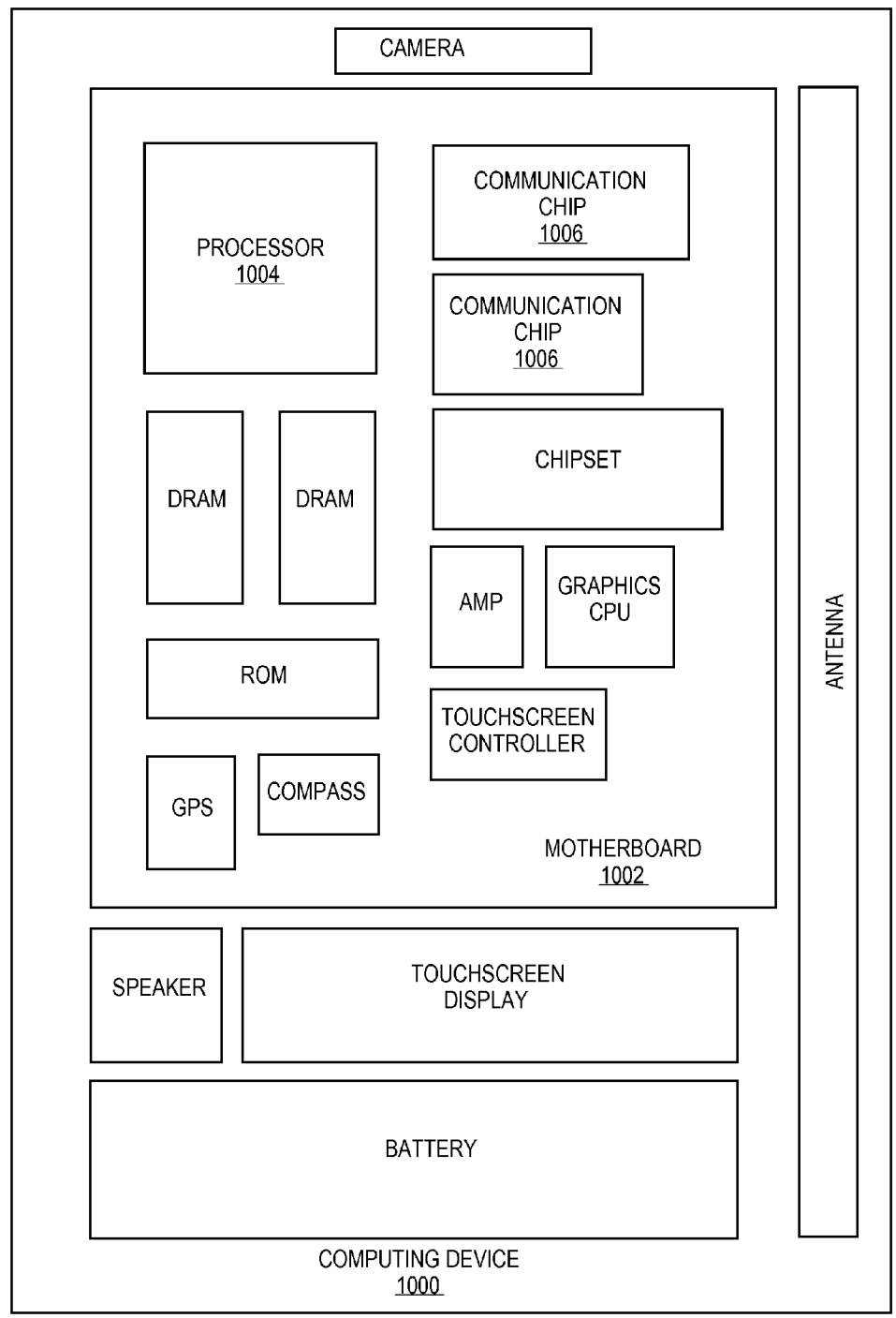
FIG. 10 illustrates a computing device in accordance with one implementation of the invention.

FIG. 10 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more devices, such as high speed precessionally switched magnetic logic devices built in accordance with implementations of the invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes one or more devices, such as high speed precessionally switched magnetic logic devices built in accordance with implementations of the invention.

In further implementations, another component housed within the computing device 1000 may contain an integrated circuit die that includes one or more devices, such as high speed precessionally switched magnetic logic devices built in accordance with implementations of the invention.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Thus, embodiments of the present invention high speed precessionally switched magnetic logic devices and architectures.

In an embodiment, a magnetic logic device includes an input electrode having a first nanomagnet and an output electrode having a second nanomagnet. The spins of the second nanomagnet are non-collinear with the spins of the first nanomagnet. A channel region and corresponding ground electrode are disposed between the input and output electrodes.

In one embodiment, the magnetic logic device further includes a metal ground line coupled to the ground electrode.

In one embodiment, the magnetic logic device further includes a supply voltage plane coupled with one or both of the first and second electrodes.

In one embodiment, one or both of the nanomagnets is composed of an elemental material such as, but not limited to, iron (Fe), cobalt (Co), nickel (Ni), or gadolinium (Gd).

In one embodiment, one or both of the nanomagnets is composed of an alloy material such as, but not limited to, cobalt iron ($Co_xFe_y$), nickel cobalt ($Ni_xCo_y$), nickel iron ($Ni_xFe_y$), cobalt iron boron ($Co_xFe_yB_z$), samarium cobalt ($Sm_xCo_y$), or neodymium iron boron ($Nd_xFe_yB_z$).

In one embodiment, one or both of the nanomagnets is composed of a Heusler Alloy material such as, but not limited to, copper manganese aluminum ($Cu_2MnAl$), copper manganese indium ($Cu_2MnIn$), copper manganese tin ($Cu_2MnSn$), copper iron silicon ($Co_2FeSi$), cobalt iron aluminum ($Co_2FeAl$), or gallium manganese (GaMn).

In one embodiment, the channel region is composed of a material such as, but not limited to, copper (Cu), aluminum (Al), silver (Ag), gold (Au), a monolayer of graphene, multi-layered graphene, or silicon, germanium, or silicon germanium alloys thereof.

In one embodiment, the magnetic logic device further includes a spin filter dielectric layer disposed adjacent to at least a portion of the channel region.

In one embodiment, the spin filter dielectric layer is composed of a material such as, but not limited to, magnesium oxide (MgO), aluminum oxide ($Al_2O_3$), mono or multilayered graphene (C), or europium oxide (EuO).

In an embodiment, a method of operating a magnetic logic device includes providing current having a net spin direction from an input electrode having a first nanomagnet to a ground channel region of the device. The current is received at an output electrode having a second nanomagnet to align the spins of the second nanomagnet. The spins of the second nanomagnet non-collinear with the spins of the first nanomagnet.

In one embodiment, providing the current from the input electrode and receiving the current at the output electrode is for precessionally switching the device.

In one embodiment, initiation of the precessional switching of the device involves using non-zero spin torque.

In one embodiment, providing the current from the input electrode and receiving the current at the output electrode involves non-inversion gating of the channel region.

In one embodiment, the non-inversion gating includes using a negative supply voltage.

In one embodiment, providing the current from the input electrode and receiving the current at the output electrode includes inversion gating of the channel region.

In one embodiment, the inversion gating includes using a positive supply voltage.

In an embodiment, a magnetic logic device includes an input electrode having an in-plane nanomagnet and an output electrode having a perpendicular magnetic anisotropy (PMA) magnet. A channel region and corresponding ground electrode are disposed between the input and output electrodes.

In one embodiment, the magnetic logic device further includes a metal ground line coupled to the ground electrode.

In one embodiment, the magnetic logic device further includes a supply voltage plane coupled with one or both of the first and second electrodes.

In one embodiment, one or both of the in-plane nanomagnet and the PMA magnet is composed of an elemental material such as, but not limited to, iron (Fe), cobalt (Co), nickel (Ni), gadolinium Gd, or atomic multilayers thereof.

In one embodiment, iron (Fe), cobalt (Co), nickel (Ni), or gadolinium (Gd) atomic multilayers are used, and are interspersed with nonmagnetic interlayers composed of palladium (Pd) or platinum (Pt).

In one embodiment, one or both of the in-plane nanomagnet and the PMA magnet is composed of an alloy material such as, but not limited to, cobalt iron ($Co_xFe_y$), nickel cobalt ($Ni_xCo_y$), nickel iron ($Ni_xFe_y$), cobalt iron boron ($Co_xFe_yB_z$), samarium cobalt ($Sm_xCo_y$), or neodymium iron boron ($Nd_xFe_yB_z$).

In one embodiment, one or both of the in-plane nanomagnet and the PMA magnet is composed of a Heusler Alloy material such as, but not limited to, copper manganese aluminum ($Cu_2MnAl$), copper manganese indium ($Cu_2MnIn$), copper manganese tin (Cu$_2$MnSn), copper iron silicon (Co$_2$FeSi), cobalt iron aluminum (Co$_2$FeAl), or gallium manganese (GaMn).

In one embodiment, the magnetic logic device further includes a spin filter dielectric layer disposed adjacent to at least a portion of the channel region.

In one embodiment, the spin filter dielectric layer is composed of a material such as, but not limited to, magnesium oxide (MgO), aluminum oxide (Al$_2$O$_3$), or europium oxide (EuO).

In one embodiment, a method of operating a magnetic logic device includes providing current having a net spin direction from an input electrode having an in-plane nanomagnet to a ground channel region of the device. The current is received at an output electrode having a perpendicular magnetic anisotropy (PMA) magnet to align the spins of the PMA magnet.

In one embodiment, providing the current from the input electrode and receiving the current at the output electrode precessionally switches the device.

In one embodiment, providing the current from the input electrode and receiving the current at the output electrode involves non-inversion gating of the channel region.

In one embodiment, the method further includes pulsing a supply voltage to obtain optimal energy operation of the device.

In one embodiment, pulsing the supply voltage includes using a pulse width selected for minimum charge injection from the supply voltage.

What is claimed is:

1. A magnetic logic device, comprising:
    an input electrode comprising a first nanomagnet;
    an output electrode comprising a second nanomagnet, the spins of the second nanomagnet non-collinear with the spins of the first nanomagnet; and
    a channel region and corresponding ground electrode disposed between the input and output electrodes, wherein the first nanomagnet has an elliptical shape with a major axis and a minor axis, and the second nanomagnet has an elliptical shape with a major axis and a minor axis, and wherein the major axis of the first nanomagnet is oriented approximately 90 degrees to the major axis of the second nanomagnet.

2. The magnetic logic device of claim 1, further comprising:
    a metal ground line coupled to the ground electrode.

3. The magnetic logic device of claim 1, further comprising:
    a supply voltage plane coupled with one or both of the first and second electrodes.

4. The magnetic logic device of claim 1, wherein one or both of the nanomagnets comprises an elemental material selected from the group consisting of iron (Fe), cobalt (Co), nickel (Ni), and gadolinium (Gd).

5. The magnetic logic device of claim 1, wherein one or both of the nanomagnets comprises an alloy material selected from the group consisting of cobalt iron (Co$_x$Fe$_y$), nickel cobalt (Ni$_x$Co$_y$), nickel iron (Ni$_x$Fe$_y$), cobalt iron boron (Co$_x$Fe$_y$B$_z$), samarium cobalt (Sm$_x$Co$_y$), and neodymium iron boron (Nd$_x$Fe$_y$B$_z$).

6. The magnetic logic device of claim 1, wherein one or both of the nanomagnets comprises a Heusler Alloy material selected from the group consisting of copper manganese aluminum (Cu$_2$MnAl), copper manganese indium (Cu$_2$MnIn), copper manganese tin (Cu$_2$MnSn), copper iron silicon (Co$_2$FeSi), cobalt iron aluminum (Co$_2$FeAl), and gallium manganese (GaMn).

7. The magnetic logic device of claim 1, wherein the channel region comprises a material selected from the group consisting of copper (Cu), aluminum (Al), silver (Ag), gold (Au), a monolayer of graphene, multi-layered graphene, and silicon, germanium, or silicon germanium alloys thereof.

8. The magnetic logic device of claim 1, further comprising:
    a spin filter dielectric layer disposed adjacent to at least a portion of the channel region.

9. The magnetic logic device of claim 8, wherein the spin filter dielectric layer comprises a material selected from the group consisting of magnesium oxide (MgO), aluminum oxide (Al$_2$O$_3$), mono or multilayered graphene (C), and europium oxide (EuO).

10. A method of operating a magnetic logic device, the method comprising:
    providing current having a net spin direction from an input electrode comprising a first nanomagnet to a ground channel region of the device; and
    receiving the current at an output electrode comprising a second nanomagnet to align the spins of the second nanomagnet, the spins of the second nanomagnet non-collinear with the spins of the first nanomagnet, wherein the first nanomagnet has an elliptical shape with a major axis and a minor axis, and the second nanomagnet has an elliptical shape with a major axis and a minor axis, and wherein the major axis of the first nanomagnet is oriented approximately 90 degrees to the major axis of the second nanomagnet.

11. The method of claim 10, wherein providing the current from the input electrode and receiving the current at the output electrode is for precessionally switching the device.

12. The method of claim 11, wherein initiation of the precessional switching of the device comprises using non-zero spin torque.

13. The method of claim 10, wherein providing the current from the input electrode and receiving the current at the output electrode comprises non-inversion gating of the channel region.

14. The method of claim 13, wherein the non-inversion gating comprising using a negative supply voltage.

15. The method of claim 10, wherein providing the current from the input electrode and receiving the current at the output electrode comprises inversion gating of the channel region.

16. The method of claim 15, wherein the inversion gating comprising using a positive supply voltage.

* * * * *